FAST RECOVERY PULSE CIRCUIT UTILIZING CAPACITOR CHARGED THROUGH SILICON CONTROLLED SWITCH AND DISCHARGED THROUGH TRANSISTOR
Filed Sept. 21, 1967
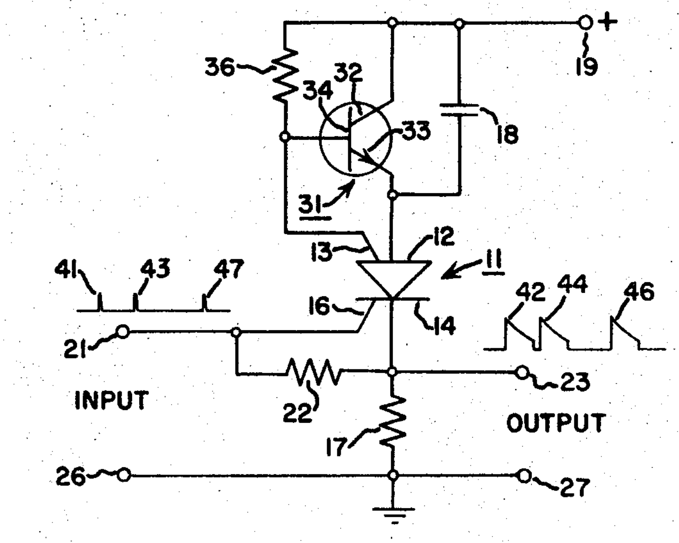
INVENTOR:
RICHARD C. WEISCHEDEL,
BY Norman C. Fulmer
HIS ATTORNEY.

3,532,906

FAST RECOVERY PULSE CIRCUIT UTILIZING CAPACITOR CHARGED THROUGH SILICON CONTROLLED SWITCH AND DISCHARGED THROUGH TRANSISTOR

Richard C. Weischedel, Camillus, N.Y., assignor to General Electric Company, a corporation of New York Filed Sept. 21, 1967, Ser. No. 669,465
Int. Cl. H03k *1/18, 4/82*
U.S. Cl. 307—267 1 Claim

ABSTRACT OF THE DISCLOSURE

A pulse circuit is disclosed which can function as a pulse amplifier and/or a pulse stretcher. The disclosed circuit includes a capacitor and a silicon controlled switch device connected to generate output pulses in response to input pulses. A transistor is connected with its collector-emitter path in parallel with the capacitor, and its base is interconnected with a gate electrode of the silicon controlled switch device so that when this device is "on" the transistor is "off" and vice versa. Thus, the transistor quickly discharges the capacitor whenever the switch device is "off," thereby achieving fast recovery of the pulse circuit after the generation of a pulse.

BACKGROUND OF THE INVENTION

Various circuits have been devised for generating, changing, and utilizing electrical pulses. Circuits for changing pulses, or for generating output pulses in response to input pulses, are required when the input pulses are of low amplitude or short duration (such as are produced by certain sensor or trigger devices) and the desired output pulses must be of greater ampliutde or longer duration (such as might be required for actuating an indicator device or a control circuit). Apparatus for increasing the time duration of a pulse is called a "pulse stretcher." Pulse stretcher circuits are used in numerous applications, including computers.

Previous pulse stretchers have frequently comprised a flip-flop circuit arranged to function as a one-shot multivibrator. The prior-art pulse stretchers require a recovery time which is undesirably long for certain applications. The recovey time is the time required for the pulse stretcher to "recover" from having generated an output pulse, so as to be ready to respond properly to the next input pulse. Failure of the circuit to recover prior to the next input pulse will result in failure to produce the next output pulse, or else the next output pulse will be distorted and hence useless. As the operating speed of computers, logic circuits, and other apparatus employing pulse circuits increases with advancing technology, it is desirable and necessary to increase the speed and reliability of the puse circuits by shortening their recovery time.

SUMMARY OF THE INVENTION

Objects of the invention are to provide an improved fast-recovery pulse circuit, and to solve the prior-art problems described above.

The improved fast recovery pulse circuit of the invention comprises, briefly and in a preferred embodiment, a capacitor and a silicon controlled switch (SCS) device connected to a voltage source, and means to apply input pulses to a gate electrode of the SCS for rendering it conductive and causing the capacitor to partially charge thereby producing output pulses respectively in response to the input pulses. A transistor is connected with its collector-emitter path in parallel with the capacitor and with its base electrode interconnected with a gate electrode of the SCS so that the transistor is "on" or conductive when the SCS is "off" or nonconductive, and vice versa, whereby the transistor quickly discharges the capacitor whenever the SCS is "off," thereby achieving fast recovery of the pulse circuit after the generation of each output pulse.

BRIEF DESCRIPTION OF THE DRAWING

The single figure of the drawing is an electrical schematic diagram of a preferred embodiment of the invention.

DESCRIPTION OF THE PREFERRED EMBODIMENT

A preferred embodiment of the invention as shown in the drawing comprises a silicon controlled switch (SCS) 11 having an anode 12, anode gate electrode 13, cathode 14, and cathode gate electrode 16. The cathode 14 is connected to electrical ground via a load resistor 17, and the anode 12 is connected via a capacitor 18 to a terminal 19 of a source of operating voltage, the other terminal of the voltage source being connected to electrical ground.

A signal input terminal 21 is connected to the cathode gate electrode 16, and a resistor 22 is connected between this gate 16 and the cathode 14. A signal output terminal 23 is connected to the cathode 14. The remaining input and output terminals 26 and 27 are electrically grounded. A suitable SCS is General Electric type 3N81.

A transistor 31 has a collector electrode 32 connected to the voltage terminal 19 and an emitter electrode 33 connected to the anode 12, and a base electrode 34 connected to the anode gate electrode 13 and also connected via a resistor 36 to the voltage terminal 19.

The circuit functions as follows. Normally the SCS 11 is "off" or nonconductive and the transistor 31 is "on" or conductive, these normal states of the devices being achieved by suitable electrical biasing of the electrodes thereof by the resistors and voltage polarity shown in the drawing. The normally conductive collector-emitter path of the transistor 31, being connected in parallel with the capacitor 18, insures that this capacitor is normally discharged and thus has a zero potential thereacross, and, since the SCS 11 is normally nonconductive, no voltage is applied across the capacitor 18.

The SCS 11 is rendered conductive by applying a positive polarity pulse to the cathode gate 16, or a negative polarity pulse to the anode gate 13. In the embodiment shown, a positive pulse 41 is applied to the cathode gate 16, rendering the SCS 11 conductive and thus applying voltage across the capacitor 18. When the SCS is thus rendered conductive, its anode gate electrode 13 becomes relatively negative in polarity from its normal state, thus reverse biasing the base electrode 34 of transistor 31 relatively negatively compared to its normal state, and rendering transistor 31 nonconductive, whereupon the capacitor 18 commences to charge, from the voltage source applied to terminal 19 and electrical ground, through the resistor 17 and anode-cathode path of the SCS 11. The capacitor charging current flowing through the resistor 17, produces an output pulse 42. While the capacitor 18 is thus partially charging, the charging current decreases to a value below the "hold-on" current required for the SCS 11 to remain conductive, whereupon the SCS becomes non-conductive and the output pulse 42 terminates. Immediately upon the SCS becoming nonconductive, its anode gate electrode 13 reverts to its normal voltage value, thus biasing the base 34 of transistor 31 to its normal conductive state, whereupon the collector-emitter path of the transistor 31 quickly discharges the capacitor 18 so as to render the circuit quickly ready to be responsive to the next input pulse. The capacitor discharge time depends on the current gain (beta) of the transistor 31 and the values of the capacitor 18 and resistor 36. The circuit has a fast recovery time of only a few microseconds upon termination of an output pulse having a duration as long as several seconds.

If the next input pulse 43 occurs at a time immediately after termination of the output pulse 42, and if the circuit has not "recovered," either no output pulse would be produced, or else it would be distorted and probably useless. However, since the circuit of the invention provides fast recovery of the pulse circuit by automatically discharging the capacitor 18 upon termination of an output pulse, the circuit will properly produce an output pulse 44 in response to the next input pulse 43. The circuit will also properly produce an output pulse 46 in response to a next input pulse 47 which occurs a considerable time after the preceding output pulse 44 terminates. The output pulses may be passed through a clipper circuit if square-wave pulses are desired.

The amplitude of the output pulses is determined by the value of the output load resistor 17 and the amount of current flow therethrough as determined by the value of voltage at terminal 19. The minimum hold-on current of the SCS 11, which determines the point at which the SCS ceases conduction and thus terminates the output pulse, depends on the particular SCS employed, and the value of the resistor 22. The time duration of the output pulses, and hence the amount of "stretching" the circuit provides, depends primarily on the hold-on current characteristic of the SCS 11, and on the values of the capacitor 18, load resistor 17, and operating voltage at terminal 19.

From the above description, it will be realized that the invention provides a fast recovery pulse circuit which responds quickly and reliably both as to input pulses occurring at differently timed intervals, and also the circuit operates at increased speed for high-speed cyclically repetitive input pulses such as are employed in computers, logic circuits and other apparatus.

While a preferred embodiment of the invention has been shown and described, various other embodiments and modifications thereof will be apparent to persons skilled in the art, and will fall within the scope of invention as defined in the following claim.

I claim:

1. A pulse circuit characterized by fast recovery upon termination of an operative cycle, comprising:

(a) a voltage source;
(b) a capacitor;
(c) a silicon controlled switch (SCS) having an anode, an anode gate electrode, a cathode, and a cathode gate electrode;
(d) a load resistor;
(e) means connecting said capacitor, said load resistor and the anode-cathode path of said SCS in a series circuit across said voltage source;
(f) means providing SCS gate electrode biasing such that the SCS is normally non-conductive, becomes conductive upon application of an input pulse to at least one of said gate electrodes thereby enabling current flow in said series circuit and generating an output pulse across said load resistor, and again becomes nonconductive to terminate the output pulse after such current flow has at least partially charged said capacitor; and
(g) a transistor having its collector-emitter path connected in parallel with said capacitor and its base electrode interconnected with said anode gate electrode of the SCS so that said transistor is conductive when said SCS is nonconductive and vice versa, whereby said capacitor may discharge through said transistor collector-emitter path when said SCS becomes non-conductive upon termination of an output pulse.

References Cited

UNITED STATES PATENTS

| | | | |
|---|---|---|---|
| 2,827,574 | 3/1958 | Schneider | 307—273 |
| 2,976,432 | 3/1961 | Geckle | 307—273 |
| 3,018,392 | 1/1962 | Jones et al. | 307—284 X |
| 3,067,342 | 12/1962 | Waller | 307—273 X |
| 3,163,778 | 12/1964 | Seurot | 307—273 |

DONALD D. FORRER, Primary Examiner
S. D. MILLER, Assistant Examiner

U.S. Cl. X.R.

307—284, 305